(12) United States Patent
Chen et al.

(10) Patent No.: US 11,257,939 B2
(45) Date of Patent: Feb. 22, 2022

(54) HIGH ELECTRON MOBILITY TRANSISTOR

(71) Applicant: UNITED MICROELECTRONICS CORP., Hsin-Chu (TW)

(72) Inventors: Yen-Hsing Chen, Taipei (TW); Yu-Ming Hsu, Changhua County (TW); Yu-Chi Wang, Taipei (TW); Tsung-Mu Yang, Tainan (TW); Yu-Ren Wang, Tainan (TW)

(73) Assignee: UNITED MICROELECTRONICS CORP., Hsin-Chu (TW)

(*) Notice: Subject to any disclaimer, the term of this patent is extended or adjusted under 35 U.S.C. 154(b) by 0 days.

(21) Appl. No.: 16/711,451

(22) Filed: Dec. 12, 2019

(65) Prior Publication Data

US 2021/0151591 A1 May 20, 2021

(30) Foreign Application Priority Data

Nov. 18, 2019 (CN) .......................... 201911125485.6

(51) Int. Cl.
*H01L 29/778* (2006.01)
*H01L 29/205* (2006.01)
*H01L 29/20* (2006.01)

(52) U.S. Cl.
CPC ...... *H01L 29/7783* (2013.01); *H01L 29/2003* (2013.01); *H01L 29/205* (2013.01); *H01L 29/7782* (2013.01)

(58) Field of Classification Search
CPC ............. H01L 29/7783; H01L 29/7787; H01L 29/7782–7785; H01L 29/7781
See application file for complete search history.

(56) References Cited

U.S. PATENT DOCUMENTS

| 7,112,830 | B2 | 9/2006 | Munns | |
|---|---|---|---|---|
| 9,685,323 | B2 | 6/2017 | Keller et al. | |
| 2011/0272665 | A1* | 11/2011 | Yamaguchi | H01L 21/02507 257/12 |
| 2012/0161152 | A1* | 6/2012 | Miyoshi | H01L 21/0254 257/76 |
| 2012/0168719 | A1* | 7/2012 | Ikuta | H01L 21/02458 257/15 |
| 2012/0211763 | A1* | 8/2012 | Yoshida | H01L 21/02458 257/76 |

(Continued)

*Primary Examiner* — Grant S Withers
(74) *Attorney, Agent, or Firm* — Winston Hsu

(57) ABSTRACT

A high electron mobility transistor (HEMT) includes a buffer layer on a substrate, in which the buffer layer includes a first buffer layer and a second buffer layer. Preferably, the first buffer layer includes a first layer of the first buffer layer comprising $Al_yGa_{1-y}N$ on the substrate and a second layer of the first buffer layer comprising $Al_xGa_{1-x}N$ on the first layer of the first buffer layer. The second buffer layer includes a first layer of the second buffer layer comprising $Al_wGa_{1-w}N$ on the first buffer layer and a second layer of the second buffer layer comprising $Al_zGa_{1-z}N$ on the first layer of the second buffer layer, in which x>z>y>w.

17 Claims, 3 Drawing Sheets

(56) References Cited

U.S. PATENT DOCUMENTS

| | | | |
|---|---|---|---|
| 2012/0261716 A1* | 10/2012 | Yanagihara | H01L 29/155 257/190 |
| 2013/0200495 A1* | 8/2013 | Keller | H01L 21/02381 257/615 |
| 2014/0374771 A1* | 12/2014 | Umeno | H01L 21/0262 257/76 |
| 2015/0060765 A1* | 3/2015 | Kotani | H01L 21/02458 257/22 |
| 2016/0118486 A1* | 4/2016 | Shikauchi | H01L 21/02381 257/76 |
| 2019/0006501 A1* | 1/2019 | Yang | H01L 29/7783 |
| 2021/0057561 A1* | 2/2021 | Hsieh | H01L 21/0251 |
| 2021/0057562 A1* | 2/2021 | Hsieh | H01L 29/7786 |

\* cited by examiner

| Layer | Composition | |
|---|---|---|
| 60 | $Al_pGa_{1-p}N$ | |
| 59 | $Al_qGa_{1-q}N$ | |
| 58 | $Al_pGa_{1-p}N$ | |
| 57 | $Al_qGa_{1-q}N$ | |
| 56 | $Al_pGa_{1-p}N$ | $tp$ |
| 55 | $Al_qGa_{1-q}N$ | $tq$ |
| 54 | $Al_pGa_{1-p}N$ | |
| 53 | $Al_qGa_{1-q}N$ | |
| 52 | $Al_pGa_{1-p}N$ | |
| 51 | $Al_qGa_{1-q}N$ | |
| 50 | $Al_zGa_{1-z}N$ | |
| 49 | $Al_wGa_{1-w}N$ | |
| 48 | $Al_zGa_{1-z}N$ | $tz$ |
| 47 | $Al_wGa_{1-w}N$ | $tw$ |
| 46 | $Al_zGa_{1-z}N$ | |
| 45 | $Al_wGa_{1-w}N$ | |
| 44 | $Al_zGa_{1-z}N$ | |
| 43 | $Al_wGa_{1-w}N$ | |
| 42 | $Al_zGa_{1-z}N$ | |
| 41 | $Al_wGa_{1-w}N$ | |
| 40 | $Al_xGa_{1-x}N$ | |
| 39 | $Al_yGa_{1-y}N$ | |
| 38 | $Al_xGa_{1-x}N$ | $tx$ |
| 37 | $Al_yGa_{1-y}N$ | $ty$ |
| 36 | $Al_xGa_{1-x}N$ | |
| 35 | $Al_yGa_{1-y}N$ | |
| 34 | $Al_xGa_{1-x}N$ | |
| 33 | $Al_yGa_{1-y}N$ | |
| 32 | $Al_xGa_{1-x}N$ | |
| 31 | $Al_yGa_{1-y}N$ | |

Layers 51–60 grouped as 500; layers 41–50 grouped as 400; layers 31–40 grouped as 300. Overall structure labeled 16.

FIG. 2

HIGH ELECTRON MOBILITY TRANSISTOR

BACKGROUND OF THE INVENTION

1. Field of the Invention

The invention relates to a high electron mobility transistor (HEMT).

2. Description of the Prior Art

High electron mobility transistor (HEMT) fabricated from GaN-based materials have various advantages in electrical, mechanical, and chemical aspects of the field. For instance, advantages including wide band gap, high break down voltage, high electron mobility, high elastic modulus, high piezoelectric and piezoresistive coefficients, and chemical inertness. All of these advantages allow GaN-based materials to be used in numerous applications including high intensity light emitting diodes (LEDs), power switching devices, regulators, battery protectors, display panel drivers, and communication devices.

SUMMARY OF THE INVENTION

According to an embodiment of the present invention, a high electron mobility transistor (HEMT) includes a buffer layer having a first buffer layer and a second buffer layer on a substrate. Preferably, the first buffer layer includes a first layer of the first buffer layer comprising $Al_yGa_{1-y}N$ and a second layer of the first buffer layer on the first layer of the first buffer layer comprising $Al_xGa_{1-x}N$. The second buffer layer includes a first layer of the second buffer layer on the first buffer layer comprising $Al_wGa_{1-w}N$; and a second layer of the second buffer layer on the first layer of the second buffer layer comprising $Al_zGa_{1-z}N$ and $x>z>y>w$.

According to another aspect of the present invention, a high electron mobility transistor (HEMT) includes a buffer layer having a first buffer layer and a second buffer layer on a substrate. Preferably, the first buffer layer includes a first layer of the first buffer layer on the substrate comprising $Al_yGa_{1-y}N$ and a second layer of the first buffer layer on the first layer of the first buffer layer comprising $Al_xGa_{1-x}N$. The second buffer layer includes a first layer of the second buffer layer on the first buffer layer comprising $Al_wGa_{1-w}N$ and a second layer of the second buffer layer on the first layer of the second buffer layer, in which the second layer of the second buffer layer comprises $Al_zGa_{1-z}N$ and a thickness of the second layer of the first buffer layer is less than a thickness of the second layer of the second buffer layer.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIG. 2 illustrates a structural view of a buffer layer of a HEMT according to an embodiment of the present invention.

DETAILED DESCRIPTION

Figure 1:
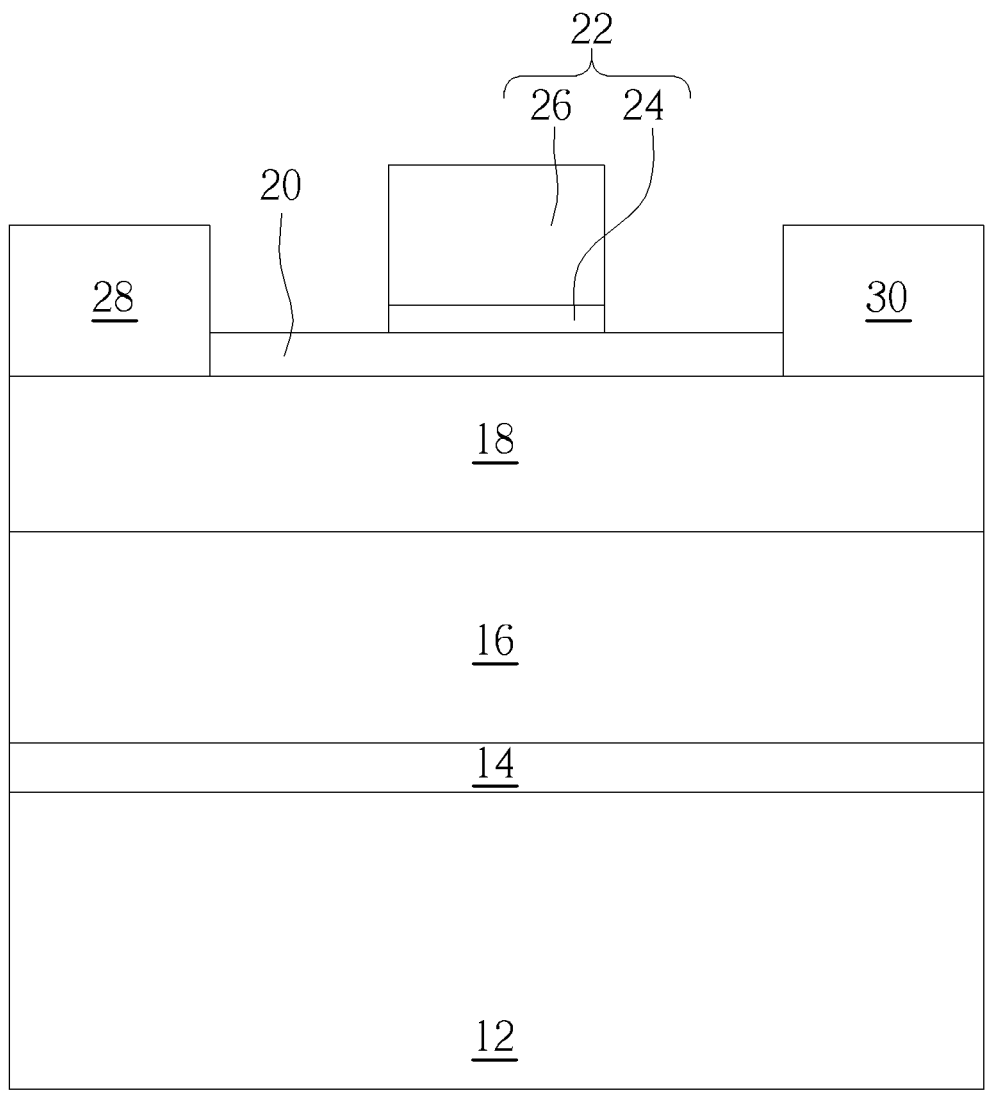
FIG. 1 illustrates a structural view of a HEMT according to an embodiment of the present invention.

Referring to FIG. 1, FIG. 1 illustrates a structural view of a HEMT according to an embodiment of the present invention. As shown in FIG. 1, a substrate 12 such as a substrate made from silicon, silicon carbide, or aluminum oxide (or also referred to as sapphire) is provided, in which the substrate 12 could be a single-layered substrate, a multi-layered substrate, gradient substrate, or combination thereof. According to other embodiment of the present invention, the substrate 12 could also include a silicon-on-insulator (SOI) substrate.

Next, a selective nucleation layer 14 and a buffer layer 16 are formed on the substrate 12. According to an embodiment of the present invention, the nucleation layer 14 preferably includes aluminum nitride (AlN) and the buffer layer 16 is preferably made of III-V semiconductors such as gallium nitride (GaN), in which a thickness of the buffer layer 16 could be between 0.5 microns to 10 microns. According to an embodiment of the present invention, the formation of the buffer layer 16 on the substrate 12 could be accomplished by a molecular-beam epitaxy (MBE) process, a metal organic chemical vapor deposition (MOCVD) process, a chemical vapor deposition (CVD) process, a hydride vapor phase epitaxy (HVPE) process, or combination thereof.

Next, an unintentionally doped (UID) buffer layer 18 is formed on the surface of the buffer layer 16. In this embodiment, the UID buffer layer 18 is preferably made of III-V semiconductors such as gallium nitride (GaN) or more specifically unintentionally doped GaN. According to an embodiment of the present invention, the formation of the UID buffer layer 18 on the buffer layer 16 could be accomplished by a molecular-beam epitaxy (MBE) process, a metal organic chemical vapor deposition (MOCVD) process, a chemical vapor deposition (CVD) process, a hydride vapor phase epitaxy (HVPE) process, or combination thereof.

Next, a barrier layer 20 is formed on the surface of the UID buffer layer 18. In this embodiment, the barrier layer 20 is preferably made of III-V semiconductor such as n-type or n-graded aluminum gallium nitride ($Al_xGa_{1-x}N$), in which $0<x<1$, the barrier layer 20 preferably includes an epitaxial layer formed through epitaxial growth process, and the barrier layer 20 could include dopants such as silicon or germanium. Similar to the buffer layer 16 and the UID buffer layer 18, the formation of the barrier layer 20 on the UID buffer layer 18 could be accomplished by a molecular-beam epitaxy (MBE) process, a metal organic chemical vapor deposition (MOCVD) process, a chemical vapor deposition (CVD) process, a hydride vapor phase epitaxy (HVPE) process, or combination thereof.

Next, a gate dielectric layer and a gate material layer are formed on the surface of the barrier layer 20, and a photo-etching process is conducted to remove part of the gate material layer and part of the gate dielectric layer to form a gate structure 22 on the surface of the barrier layer 20, in which the gate structure 22 preferably includes a patterned gate dielectric layer 24 and a gate electrode 26. In this embodiment, the bottom portion of the gate electrode 26 could include semiconductor material such as p-type GaN while the top portion of the gate electrode 26 could include metal such as Schottky metal including but not limited to for example gold (Au), silver (Ag), or platinum (Pt). The gate dielectric layer 24 could include silicon oxide, aluminum nitride (AlN), or aluminum oxide (AlO).

Next, a source electrode 28 and a drain electrode 30 are formed adjacent to two sides of the gate electrode 26. In this embodiment, the source electrode 28 and the drain electrode 30 are preferably made of metal. Nevertheless, in contrast to the top portion of the gate electrode 26 made of Schottky metal, the source electrode 28 and the drain electrode 30 are preferably made of ohmic contact metals. According to an embodiment of the present invention, each of the source electrode 28 and drain electrode 30 could include titanium (Ti), aluminum (Al), tungsten (W), palladium (Pd), or combination thereof. Moreover, it would be desirable to first conduct a photo-etching process to remove part of the barrier layer 20 adjacent to two sides of the gate electrode 26 for forming a recess, conduct an electroplating process, sputtering process, resistance heating evaporation process, electron beam evaporation process, physical vapor deposition (PVD) process, chemical vapor deposition (CVD) process, or combination thereof to form electrode materials in the recess, and then pattern the electrode materials through etching process to form the source electrode 28 and the drain electrode 30.

Referring again to FIG. 2, FIG. 2 illustrates a structural view of the buffer layer 16 of a HEMT according to an embodiment of the present invention. As shown in FIG. 2, the buffer layer 16 includes a first buffer layer 300, a second buffer layer 400, and a third buffer layer 500, in which the first buffer layer 300 further includes a first layer 31, a second layer 32, a third layer 33, a fourth layer 34, a fifth layer 35, a sixth layer 36, a seventh layer 37, an eighth layer 38, a ninth layer 39, and tenth layer 40, the second buffer layer 400 includes a first layer 41, a second layer 42, a third layer 43, a fourth layer 44, a fifth layer 45, a sixth layer 46, a seventh layer 47, an eighth layer 48, a ninth layer 49, and tenth layer 50, and the third buffer layer 500 includes a first layer 51, a second layer 52, a third layer 53, a fourth layer 54, a fifth layer 55, a sixth layer 56, a seventh layer 57, an eighth layer 58, a ninth layer 59, and tenth layer 60.

In this embodiment, the odd number layers within the first buffer layer 300 preferably include $Al_yGa_{1-y}N$ while the even number layers include $Al_xGa_{1-x}N$. For instance, the first layer 31, the third layer 33, the fifth layer 35, the seventh layer 37, and the ninth layer 39 preferably include $Al_yGa_{1-y}N$ while the second layer 32, the fourth layer 34, the sixth layer 36, the eighth layer 38, and the tenth layer 40 include $Al_xGa_{1-x}N$. The odd number layers within the second buffer layer 400 preferably include $Al_wGa_{1-w}N$ while the even number layers include $Al_zGa_{1-z}N$. For instance, the first layer 41, the third layer 43, the fifth layer 45, the seventh layer 47, and the ninth layer 49 preferably include $Al_wGa_{1-w}N$ while the second layer 42, the fourth layer 44, the sixth layer 46, the eighth layer 48, and the tenth layer 50 include $Al_zGa_{1-z}N$. The odd number layers within the third buffer layer 500 preferably include $Al_qGa_{1-q}N$ while the even number layers include $Al_pGa_{1-p}N$. For instance, the first layer 51, the third layer 53, the fifth layer 55, the seventh layer 57, and the ninth layer 59 preferably include $Al_qGa_{1-q}N$ while the second layer 52, the fourth layer 54, the sixth layer 56, the eighth layer 58, and the tenth layer 60 include $Al_pGa_{1-p}N$.

According to a first embodiment of the present invention, each of the odd number layers and the even number layers within the first buffer layer 300, the second buffer layer 400, and the third buffer layer 500 include different concentrations of aluminum. For instance, the aluminum concentration index x from the even number layers of the first buffer layer 300 is preferably greater than the aluminum concentration index z from the even number layers of the second buffer layer 400, the aluminum concentration index z from the even number layers of the second buffer layer 400 is greater than the aluminum concentration index p from even number layers of the third buffer layer 500, the aluminum concentration index p from even number layers of the third buffer layer 500 is greater than the aluminum concentration index y from odd number layers of the first buffer layer 300, the aluminum concentration index y from odd number layers of the first buffer layer 300 is greater than the aluminum concentration index w from odd number layers of the second buffer layer 400, the aluminum concentration index w from odd number layers of the second buffer layer 400 is greater than the aluminum concentration index q from odd number layers of the third buffer layer 500, or overall x>z>p>y>w>q.

Moreover in the first embodiment of the present invention, the aluminum concentration index of the odd number layers and the even number layers from the first buffer layer 300, the second buffer layer 400, and the third buffer layer 500 could be having the aforementioned relationship of x>z>p>y>w>q as each of the odd number layers and even number layers could also include same or different thicknesses. For instance, the thickness tx of each of the even number layers of the first buffer layer 300 could be equal to the thickness tz of each of the even number layers of the second buffer layer 400, the thickness tz of each of the even number layers of the second buffer layer 400 could be equal to the thickness tp of each of the even number layers of the third buffer layer 500, the thickness tp of each of the even number layers of the third buffer layer 500 could be less than the thickness ty of each of the odd number layers of the first buffer layer 300, the thickness ty of each of the odd number layers of the first buffer layer 300 could be equal to the thickness tw of each of the odd number layers of the second buffer layer 400, the thickness tw of each of the odd number layers of the second buffer layer 400 could be equal to the thickness tq of each of the odd number layers of the third buffer layer 500, or overall tx=tz=tp<ty=tw=tq.

Figure 3:
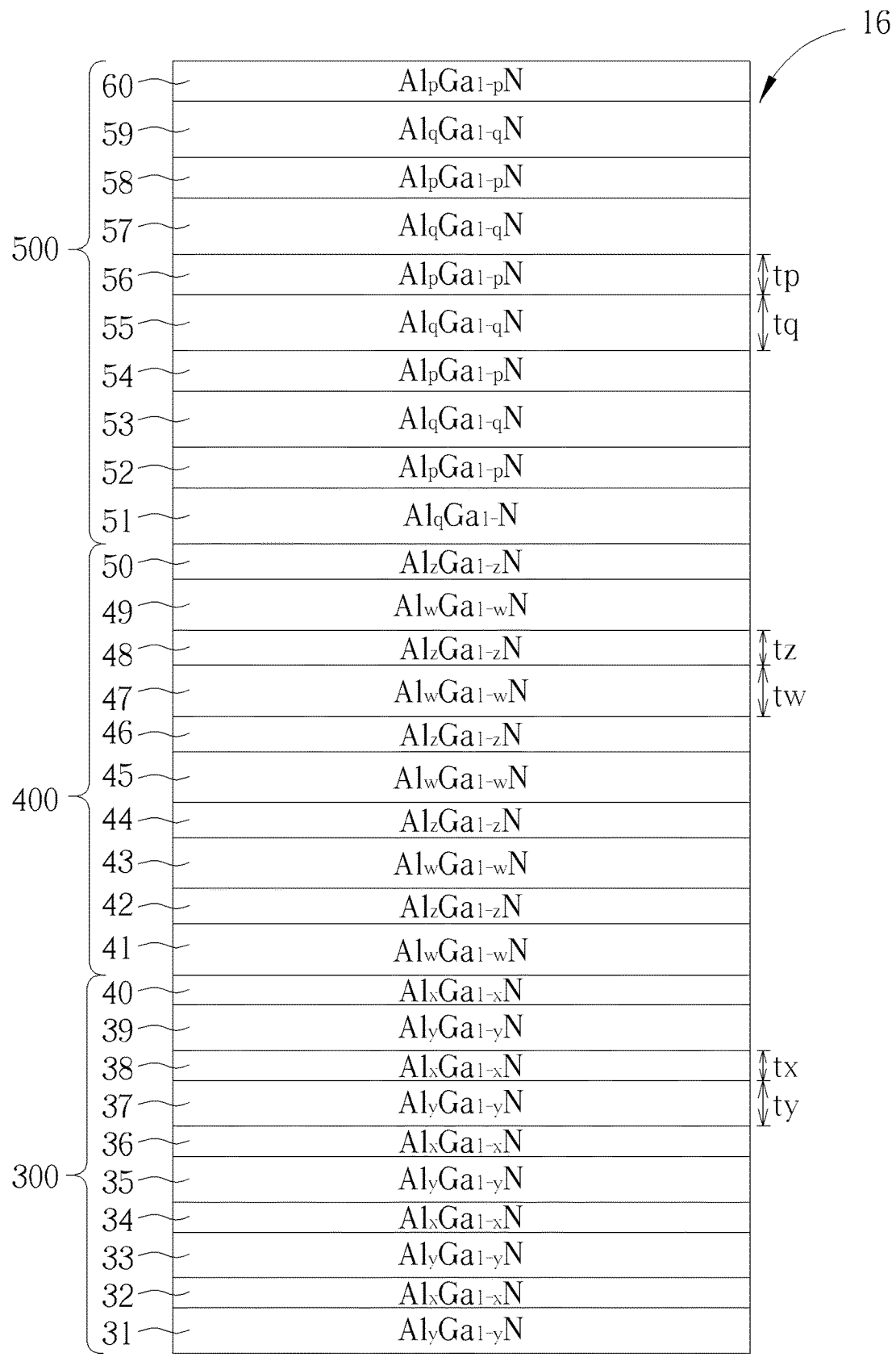
FIG. 3 illustrates a structural view of a buffer layer of a HEMT according to an embodiment of the present invention.

Referring to FIG. 3, FIG. 3 illustrates a structural view of the buffer layer 16 of a HEMT according to an embodiment of the present invention. As shown in FIG. 3, each of the odd number layers and even number layers of the first buffer layer 300, the second buffer layer 400, and the third buffer layer 500 could include different thicknesses according to a second embodiment of the present invention. For instance, the thickness tx of each of the even number layers of the first buffer layer 300 could be less than the thickness tz of each of the even number layers of the second buffer layer 400, the thickness tz of each of the even number layers of the second buffer layer 400 could be less than the thickness tp of each of the even number layers of the third buffer layer 500, the thickness tp of each of the even number layers of the third buffer layer 500 could be less than the thickness ty of each of the odd number layers of the first buffer layer 300, the thickness ty of each of the odd number layers of the first buffer layer 300 could be less than the thickness tw of each of the odd number layers of the second buffer layer 400, the thickness tw of each of the odd number layers of the second buffer layer 400 could be less than the thickness tq of each of the odd number layers of the third buffer layer 500, or overall tx<tz<tp<ty<tw<tq.

It should be noted that in additional to the odd number layers and the even number layers from the first buffer layer 300, the second buffer layer 400, and the third buffer layer 500 having different thicknesses overall as disclosed previously, each of the odd number layers and even number layers could also be having same or different thickness depending on the demand of the product. For instance, each of the even number layers of the first buffer layer 300 could be having same thickness tx, each of the even number layers of the second buffer layer 400 could be having same thickness tz, each of the even number layers of the third buffer layer 500 could be having same thickness tp, each of the odd number layers of the first buffer layer 300 could be having same thickness ty, each of the odd number layers of the second buffer layer 400 could be having same thickness tw, and each of the odd number layers of the third buffer layer 500 could be having same thickness tq, in which tx<tz<tp<ty<tw<tq.

Alternatively, instead of having the odd number layers and the even number layers from the first buffer layer 300, the second buffer layer 400, and the third buffer layer 500 having different thicknesses overall while each of the odd number layers having same thickness and each of the even number layers having same thickness, the odd number layers and the even number layers from the first buffer layer 300, the second buffer layer 400, and the third buffer layer 500 could be having different thicknesses overall according to the aforementioned thickness relationship tx<tz<tp<ty<tw<tq while each of the odd number layers and even number layers are also having different thicknesses. For instance, each of the even number layers of the first buffer layer 300 could have different thicknesses tx, in which the thickness of the second layer 32 could be less than or greater than the thickness of the fourth layer 34, the thickness of the fourth layer 34 could be less than or greater than the thickness of the sixth layer 36, the thickness of the sixth layer 36 could be less than or greater than the thickness of the eighth layer 38, the thickness of the eighth layer 38 could be less than or greater than the thickness of the tenth layer 40, and the thickness tx of each of the second layer 32, fourth layer 34, sixth layer 36, eighth layer 38, and tenth layer 40 is preferably less than the thickness tz of each of the even number layers of the second buffer layer 400.

Each of the even number layers of the second buffer layer 400 could have different thicknesses tz, in which the thickness of the second layer 42 could be less than or greater than the thickness of the fourth layer 44, the thickness of the fourth layer 44 could be less than or greater than the thickness of the sixth layer 46, the thickness of the sixth layer 46 could be less than or greater than the thickness of the eighth layer 48, the thickness of the eighth layer 48 could be less than or greater than the thickness of the tenth layer 50, and the thickness tz of each of the second layer 42, fourth layer 44, sixth layer 46, eighth layer 48, and tenth layer 40 is preferably less than the thickness tp of each of the even number layers of the third buffer layer 500.

Each of the even number layers of the third buffer layer 500 could have different thicknesses tp, in which the thickness of the second layer 52 could be less than or greater than the thickness of the fourth layer 54, the thickness of the fourth layer 54 could be less than or greater than the thickness of the sixth layer 56, the thickness of the sixth layer 56 could be less than or greater than the thickness of the eighth layer 58, the thickness of the eighth layer 58 could be less than or greater than the thickness of the tenth layer 60, and the thickness tp of each of the second layer 52, fourth layer 54, sixth layer 56, eighth layer 58, and tenth layer 60 is preferably less than the thickness ty of each of the odd number layers of the first buffer layer 300.

Each of the odd number layers of the first buffer layer 300 could have different thicknesses ty, in which the thickness of the first layer 31 could be less than or greater than the thickness of the third layer 33, the thickness of the third layer 33 could be less than or greater than the thickness of the fifth layer 35, the thickness of the fifth layer 35 could be less than or greater than the thickness of the seventh layer 37, the thickness of the seventh layer 37 could be less than or greater than the thickness of the ninth layer 39, and the thickness ty of each of the first layer 31, third layer 33, fifth layer 35, seventh layer 37, and ninth layer 39 is preferably less than the thickness tw of each of the odd number layers of the second buffer layer 400.

Each of the odd number layers of the second buffer layer 400 could have different thicknesses tw, in which the thickness of the first layer 41 could be less than or greater than the thickness of the third layer 43, the thickness of the third layer 43 could be less than or greater than the thickness of the fifth layer 45, the thickness of the fifth layer 45 could be less than or greater than the thickness of the seventh layer 47, the thickness of the seventh layer 47 could be less than or greater than the thickness of the ninth layer 49, and the thickness tw of each of the first layer 41, third layer 43, fifth layer 45, seventh layer 47, and ninth layer 49 is preferably less than the thickness tq of each of the odd number layers of the third buffer layer 500.

Each of the odd number layers of the third buffer layer 500 could have different thicknesses tq, in which the thickness of the first layer 51 could be less than or greater than the thickness of the third layer 53, the thickness of the third layer 53 could be less than or greater than the thickness of the fifth layer 55, the thickness of the fifth layer 55 could be less than or greater than the thickness of the seventh layer 57, and the thickness of the seventh layer 57 could be less than or greater than the thickness of the ninth layer 59.

In addition to each of the odd number layers and the even number layers from the first buffer layer 300, the second buffer layer 400, and the third buffer layer 500 having different thicknesses as disclosed in the second embodiment, each of the odd number layers and even number layers could also include same and/or different aluminum concentration index. For instance, the aluminum concentration index x of the even number layers of the first buffer layer 300 could be equal to the aluminum concentration index z of the even number layers of the second buffer layer 400, the aluminum concentration index z of the even number layers of the second buffer layer 400 could be equal to the aluminum concentration index p of the even number layers of the third buffer layer 500, the aluminum concentration index p of the even number layers of the third buffer layer 500 could be greater than the aluminum concentration index y of the odd number layers of the first buffer layer 300, the aluminum concentration index y of the odd number layers of the first buffer layer 300 could be equal to the aluminum concentration index w of the odd number layers of the second buffer layer 400, the aluminum concentration index w of the odd number layers of the second buffer layer 400 could be equal to the aluminum concentration index q of the odd number layers of the third buffer layer 500, or overall x=z=p>y=w=q.

It should be noted that even though three buffer layers including the first buffer layer 300, the second buffer layer 400, and the third buffer layer 500 and buffer layers preferably made of five layers of $Al_yGa_{1-y}N$, five layers of $Al_xGa_{1-x}N$, five layers of $Al_wGa_{1-w}N$, five layers of $Al_zGa_{1-z}N$, five layers of $Al_qGa_{1-q}N$, and five layers of $Al_pGa_{1-p}N$ are disclosed in the aforementioned embodiments, the number of the buffer layers and the number of each of the buffer layers could all be adjusted according to the demand of the product. For instance, it would be desirable to only form two buffer layers such as a first buffer layer 300 and a second buffer layer 400 on the substrate 12, in which the first buffer layer 300 only includes a first layer 31 and a second layer 32, the second buffer layer 400 also only includes a first layer 41 and a second layer 42, and the first layer 31 of the first buffer layer 300 preferably contacts the nucleation layer 14 or the substrate 12 directly as the second layer 42 of the second buffer layer 400 contacts the UID buffer layer 18 directly, which is also within the scope of the present invention. By following the aforementioned approach to repeatedly stack buffer layers having different aluminum concentrations and/or different thicknesses, it would be desirable to relieve strain resides within the buffer layers thereby improving the overall performance of the HEMT.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A high electron mobility transistor (HEMT), comprising:
    a nucleation layer on a substrate;
    a buffer layer on the nucleation layer, wherein the buffer layer comprises:
        a first buffer layer comprising:
            a first layer of the first buffer layer on and directly contacting a top surface of the nucleation layer, wherein the first layer of the first buffer layer comprises $Al_yGa_{1-y}N$;
            a second layer of the first buffer layer on and directly contacting a top surface of the first layer of the first buffer layer, wherein the second layer of the first buffer layer comprises $Al_xGa_{1-x}N$;
        a second buffer layer comprising:
            a first layer of the second buffer layer on the first buffer layer, wherein the first layer of the second buffer layer comprises $Al_wGa_{1-w}N$; and
            a second layer of the second buffer layer on a top surface of the first layer of the second buffer layer, wherein the second layer of the second buffer layer comprises $Al_zGa_{1-z}N$ and $x>z>y>w$;
        a third buffer layer comprising:
            a first layer of the third buffer layer on the second buffer layer, wherein the first layer of the third buffer layer comprises $Al_qGa_{1-q}N$; and
            a second layer of the third buffer layer on the first layer of the third buffer layer, wherein the second layer of the third buffer layer comprises $Al_pGa_{1-p}N$ and $x>z>p>y>w>q$.

2. The HEMT of claim 1, wherein the first buffer layer comprises:
    a third layer of the first buffer layer on the second layer of the first buffer layer, wherein the third layer of the first buffer layer comprises $Al_yGa_{1-y}N$; and
    a fourth layer of the first buffer layer on the third layer of the first buffer layer, wherein the fourth layer of the first buffer layer comprises $Al_xGa_{1-x}N$.

3. The HEMT of claim 1, wherein the second buffer layer comprises:
    a third layer of the second buffer layer on the second layer of the second buffer layer, wherein the third layer of the second buffer layer comprises $Al_wGa_{1-w}N$; and
    a fourth layer of the second buffer layer on the third layer of the second buffer layer, wherein the fourth layer of the second buffer layer comprises $Al_zGa_{1-z}N$.

4. The HEMT of claim 1, wherein the third buffer layer comprises:
    a third layer of the third buffer layer on the second layer of the third buffer layer, wherein the third layer of the third buffer layer comprises $Al_qGa_{1-q}N$; and
    a fourth layer of the third buffer layer on the third layer of the third buffer layer, wherein the fourth layer of the third buffer layer comprises $Al_pGa_{1-p}N$.

5. The HEMT of claim 1, wherein a thickness of the first layer of the first buffer layer is equal to a thickness of the first layer of the second buffer layer.

6. The HEMT of claim 1, wherein a thickness of the second layer of the first buffer layer is equal to a thickness of the second layer of the second buffer layer.

7. The HEMT of claim 1, wherein a thickness of the second layer of the first buffer layer is less than a thickness of the first layer of the first buffer layer.

8. The HEMT of claim 1, wherein a thickness of the second layer of the second buffer layer is less than a thickness of the first layer of the second buffer layer.

9. The HEMT of claim 1, further comprising:
    an unintentionally doped (UID) buffer layer on the buffer layer;
    a barrier layer on the UID buffer layer;
    a gate electrode on the barrier layer; and
    a source electrode and a drain electrode adjacent to two sides of the gate electrode.

10. A high electron mobility transistor (HEMT), comprising:
    a nucleation layer on a substrate;
    a buffer layer on the nucleation layer, wherein the buffer layer comprises:
        a first buffer layer comprising:
            a first layer of the first buffer layer on and directly contacting a top surface of the nucleation layer, wherein the first layer of the first buffer layer comprises $Al_yGa_{1-y}N$;
            a second layer of the first buffer layer on a top surface of the first layer of the first buffer layer, wherein the second layer of the first buffer layer comprises $Al_xGa_{1-x}N$;
        a second buffer layer comprising:
            a first layer of the second buffer layer on and directly contacting the first buffer layer, wherein the first layer of the second buffer layer comprises $Al_wGa_{1-w}N$ and the first layer of the second buffer layer is made of a single material; and
            a second layer of the second buffer layer on a top surface of the first layer of the second buffer layer, wherein the second layer of the second buffer layer comprises $Al_zGa_{1-z}N$, the second layer of the second buffer layer is made of a single material, a total thickness of the second layer of the first buffer layer is less than a total thickness of the second layer of the second buffer layer, and a total thickness of the first layer of the first buffer layer is less than a total thickness of the first layer of the second buffer layer;
        a third buffer layer comprising:
            a first layer of the third buffer layer on the second buffer layer, wherein the first layer of the third buffer layer comprises $Al_qGa_{1-q}N$; and
            a second layer of the third buffer layer on the first layer of the third buffer layer, wherein the second layer of the third buffer layer comprises $Al_pGa_{1-p}N$ and $x=z=p>y=w=q$.

11. The HEMT of claim 10, wherein the first buffer layer comprises:

a third layer of the first buffer layer on the second layer of the first buffer layer, wherein the third layer of the first buffer layer comprises $Al_yGa_{1-y}N$; and a fourth layer of the first buffer layer on the third layer of the first buffer layer, wherein the fourth layer of the first buffer layer comprises $Al_xGa_{1-x}N$.

12. The HEMT of claim 10, wherein the second buffer layer comprises:

a third layer of the second buffer layer on the second layer of the second buffer layer, wherein the third layer of the second buffer layer comprises $Al_wGa_{1-w}N$; and a fourth layer of the second buffer layer on the third layer of the second buffer layer, wherein the fourth layer of the second buffer layer comprises $Al_zGa_{1-z}N$.

13. The HEMT of claim 10, wherein the third buffer layer comprises:

a third layer of the third buffer layer on the second layer of the third buffer layer, wherein the third layer of the third buffer layer comprises $Al_qGa_{1-q}N$; and a fourth layer of the third buffer layer on the third layer of the third buffer layer, wherein the fourth layer of the third buffer layer comprises $Al_pGa_{1-p}N$.

14. The HEMT of claim 10, wherein a thickness of the second layer of the second buffer layer is less than a thickness of the second layer of the third buffer layer.

15. The HEMT of claim 10, wherein a thickness of the second layer of the third buffer layer is less than a thickness of the first layer of the first buffer layer.

16. The HEMT of claim 10, wherein a thickness of the first layer of the second buffer layer is less than a thickness of the first layer of the third buffer layer.

17. The HEMT of claim 10, further comprising:

an unintentionally doped (UID) buffer layer on the buffer layer;

a barrier layer on the UID buffer layer;

a gate electrode on the barrier layer; and a source electrode and a drain electrode adjacent to two sides of the gate electrode.

* * * * *